(12) United States Patent
Ballato

(10) Patent No.: US 8,365,373 B1
(45) Date of Patent: Feb. 5, 2013

(54) AGILE TUNABLE PIEZOELECTRIC SOLIDLY-MOUNTED RESONATOR

(75) Inventor: Arthur Ballato, Oceanport, NJ (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 908 days.

(21) Appl. No.: 12/456,264

(22) Filed: Jun. 12, 2009

Related U.S. Application Data

(62) Division of application No. 12/154,810, filed on May 23, 2008, now Pat. No. 7,554,244.

(51) Int. Cl.
*H04R 17/10* (2006.01)
*G01R 31/28* (2006.01)

(52) U.S. Cl. ............ 29/25.35; 29/594; 29/593; 29/830; 333/192

(58) Field of Classification Search ............... 29/25.35, 29/594, 593, 830, 831; 310/320, 322, 324; 333/189, 192, 32
See application file for complete search history.

(56) References Cited

U.S. PATENT DOCUMENTS 5,271,133 A * 12/1993 Dam et al. .............. 29/25.35
6,963,257 B2 * 11/2005 Ella et al. ................ 333/189 X

FOREIGN PATENT DOCUMENTS

JP          01277011 A * 11/1989 ............... 29/25.35

OTHER PUBLICATIONS

Lakin, Kenneth M., "Thin Film Resonator Technology", IEEE Transactions on Ultrasonics, Ferroelectrics, and Frequency Control, vol. 52, No. 525, May 2005, pp. 707-716.
Salgar, Sushant et al, "Modeling and Simulation of the Film Bulk Acoustic Resonator", 2002 IEEE International Frequency Control Symposium and PDA Exhibition, Jan. 2002, pp. 40-44.
Lakin, Kenneth M., "A Review of Thin-Film Resonator Technology", 2003 IEEE, IEEE Microwave Magazine, Dec. 2003, pp. 61-67.
Weigel, R. et al, "Microwave Acoustic Materials, Devices, and Applications," IEEE Trans.Microwave Theory Tech., vol. 50, No. 3, Mar. 2002, pp. 738-749.
Nakamura, Kiyoshi et al,"Theoretical Analysis of a Piezoelectric Thin Film Resonator With Acoustic Quarter-Wave Multilayers", 1998 IEEE International Frequency Control Symposium, May 1998, pp. 876-881.
Newell, W.E., "Ultrasonics in Integrated Electronics", Proceedings of the IEEE, vol. 53, No. 10, Oct. 1965, pp. 1305-1310.
Newell, W.E., "Face-Mounted Piezoelectric Resonators", Proceedings of the IEEE, vol. 53, Oct. 1965, pp. 575-582.
Newell, W.E.; Tuned Integrated Circuits—A State—of—the—Art Survey, Proceedings of the IEEE,vol. 52, Dec. 1964, pp. 1603-1609.
Lakin, K.M. et al, "Solidly Mounted Resonators and Filters", 1995 IEEE Ultrasonic Symposium, Jun. 1995, pp. 905-908.
Park, Y.S. et al, "a 2.4GHz VCO with an Integrated Acoustic Solidly Mounted Resonator", 2001 IEEE Ultrasonics Symposium, Jan. 2001, pp. 839-842.

* cited by examiner

*Primary Examiner* — A. Dexter Tugbang
(74) *Attorney, Agent, or Firm* — Stephen J. Harbulak

(57) ABSTRACT

Though the initial concept of the face-mounted resonator was ahead of fabrication technology, the solidly-mounted resonator (SMR) is now a practical resonator design yielding high Qs in a space-efficient and robust mounting configuration. An agile tunable piezoelectric SMR is now provided with a resonator and alternating stacks of high mechanical impedance and low mechanical impedance, piezoelectric layers advantageously stacked on a substrate with the piezoelectric layers connected to an adaptive circuit that alternates with an external electrical impedance having values anywhere between an open circuit and a short circuit. The piezoelectric Bragg stacks with alternating layers of high and low mechanical impedance and properties made variable via the additional piezoelectric properties of the stack materials overcomes difficulties caused by the limitations of manufacturing techniques, acoustic power leakage and inability to meet the single-frequency, quarter-wavelength criterion due to manufacturing deviations.

7 Claims, 4 Drawing Sheets

AGILE TUNABLE PIEZOELECTRIC SOLIDLY-MOUNTED RESONATOR

This application is a divisional application of U.S. Patent Office Application Ser. No. 12/154,810, entitled "Agile Tunable Piezoelectric Solidly Mounted Resonator," which was filed on May 23, 2008 now U.S. Pat. No. 7,554,244. A patent based on that Parent Application is about to be granted. That Parent Application was filed by the same inventor herein, is currently pending before the U.S. Patent Office and, under 35 USC §120, is "an application similarly entitled to the benefit of the filing date of the first application." This divisional application is being filed under 35 USC §120, 35 USC §121 and 37 CFR §1.53 (b), and priority from the May 23, 2008 effective date of the Parent application Ser. No. 12/154,810 is hereby claimed.

GOVERNMENT INTEREST

The invention described herein may be manufactured, used, imported, sold, and licensed by or for the Government of the United States of America without the payment to me of any royalty thereon.

FIELD OF THE INVENTION

This invention relates in general to field of solid-state acoustic devices. In particular, this invention relates to an agile tunable piezoelectric solidly-mounted resonator.

BACKGROUND OF THE INVENTION

The face-mounted resonator was described by Newell in 1964 and consisted of a piezo-active resonator surmounting a stack of quarter-wavelength layers of alternating acoustic impedance that was bonded to a robust substrate. The most important feature of that configuration was mechanical impedance at the resonator mounting surface that approximated a short circuit so as to maintain high resonator quality factor (Q) values. Despite encouraging preliminary experimental results, the necessary microfabrication technologies were not available. Recent advanced fabrication modalities have led to more modern realizations of the face-mounted resonator, which are now known as the solidly-mounted resonator (SMR).

Acoustic stack plates in SMRs have been used only for their mechanical properties as impedance transformers, but stacks with a piezoelectric layer provide an additional degree of freedom, because the electrical boundary condition on the piezoelectric layer may be altered. FIG. 1 schematically depicts several stacked layers of a prior art SMR. The stacked layers perform in a manner similar to a Bragg antireflective coating used on camera lenses. But instead of alternating layers with high and low indices of refraction, the stack consists of alternating layers of high and low acoustic impedance materials. However, having alternating layers is not enough. The necessary condition is that at the frequency of interest each layer needs to be approximately ¼ of a wavelength thick.

Each stacked layer can be considered an acoustic transmission line (TL) able to transform any impedance attached to one end, so that when looking into the other TL end, one sees different impedance. If an impedance $Z_T$, where subscript "T" is termination, is attached to one end of a TL having a characteristic impedance $Z_o$, then looking into the other end of the TL, one sees an input impedance given by the following expression:

$$Z_{input}=Z_o[Z_T+jZ_o\tan(\theta)]/[Z_o+jZ_T\tan(\theta)]; \theta=(2\pi f l)/v, \quad \text{Equation (1)}$$

where "f" is the operating frequency, "l" is the geometrical thickness of the layer, "v" is the acoustic velocity in the layer, and the wavelength is $\lambda=v/f$.

When the TL is of negligible length, f is approximately zero, so $\theta$ and $\tan(\theta)$ are about zero. In this case, $Z_{input}$ is about $Z_T$. But where frequency is such that l is approximately $\lambda/4$, then $\theta$ will be about $\pi/2$, $\tan(\theta)$ will be very large, and the two tangents will cancel out, leaving $Z_{input}$ about equal to $Z_o^2/Z_T$. Thus, in the vicinity of this particular frequency, the input impedance will change from $Z_T$ to $Z_o^2/Z_T$.

The transformation taking place when the stack consists of alternating layers of high ($Z_H$) and low ($Z_L$) impedance values, and each is about $\lambda/4$ thick, results in an input mechanical impedance at the face of the resonator of approximately $[Z_L(Z_L/Z_H)^N]$, where N is the number of pairs of layers. This means that the bonded face of the resonator "sees" very low acoustic impedance. A low value of acoustic impedance, which approximates a mechanical short circuit, means that the resonator face is substantially traction-free, and decoupled from the layers and substrate. This type of resonator is unable to radiate any acoustic power down the stack and into the substrate; so that virtually all energy is reflected back into the resonator, which should leave the ideal situation of an undiminished Q. Theoretically, the only source of loss is the loss within the resonator itself; for low acoustic loss materials, this is quite small, and high Q values could be realized. However, such benefits remain largely theoretical and have not yet been reliably and routinely attained in manufacturing, largely due to the inability to insure the $\lambda/4$ thick wavelength condition at the single operating frequency.

The prior art stacked piezoelectric SMR has not realized its full potential for several reasons, including manufacturing limitations and the fact that devices that use resonators operate over a range of frequencies. Manufacturing difficulties make it infeasible for all layers to have exactly the same acoustic length; those skilled in the art realize that there will always be some fabrication deviations from the ideal, leading to suboptimal performance. Inasmuch as devices using resonators, such as filters, operate over a range of frequencies, even if the stack layers are $\lambda/4$ thick at one frequency, they cannot be at any other frequency, since $\lambda=v/f$, because as frequency changes, so does $\lambda$.

Thus, there has been a long-felt need for an SMR configuration that can overcome and obviate the prior art manufacturing limitations and the disadvantages and shortcomings of leakage and an unwanted frequency shift.

SUMMARY OF THE INVENTION

Manufacturing difficulties make it infeasible for all layers to have exactly the same acoustic length. It is understood that there will always be some fabrication deviations from the ideal that could lead to suboptimal performance, but utilizing piezoelectric, rather than purely mechanical strata does afford the possibility of loading the electrical ports to change properties, and thereby to change the characteristics of the SMR. One simple method of operation is to alternate between an open circuit condition, and a short circuit condition. Since the SMR can be mounted contiguous to an integrated circuit, or even be an integral part of one, it is quite easy to have a great many transistors, diodes, and capacitors available to perform the necessary switching and adjusting functions. Despite the potential advantages of loading electrical ports to change the characteristics of the piezoelectric SMR, up until now this potential has not been realized, since use of strata having both mechanical and piezoelectric properties has never occurred in the prior art. In order to satisfy the long-felt need for an easy to manufacture piezoelectric SMR that overcomes the disadvantages, shortcomings and limitations of acoustic power leakage and an inability to meet the single-frequency, quarter-wavelength criterion due to manufacturing deviations, the present invention provides a resonator structure with piezoelectric strata that can alternate between an open circuit condition and a short circuit condition, or between any impedance condition from open circuit to short circuit.

Accordingly, it is an object of the present invention to provide an agile tunable piezoelectric SMR.

It is another object of the present invention to provide an agile tunable piezoelectric SMR with a multiple bi-layer Bragg stack.

It is still a further object of the present invention is to provide an agile tunable piezoelectric SMR with a multiple bi-layer Bragg stack having the capacity to operate anywhere between open circuit and short circuit conditions.

It is yet another object of the present invention is to provide methods of stacking piezoelectric layers in an agile piezoelectric SMR with a multiple bi-layer Bragg stack having the capacity to operate anywhere between open circuit and short circuit conditions.

These and other objects and advantages are provided by this invention's agile tunable piezoelectric SMR. This invention's agile tunable piezoelectric SMR, comprises a resonator and alternating stacks of high mechanical impedance and low mechanical impedance, piezoelectric layers advantageously stacked on a substrate with the piezoelectric layers connected to an adaptive circuit that alternates with an external electrical impedance having values anywhere between an open circuit and a short circuit. This invention's innovative piezoelectric Bragg stacks with alternating layers of high and low mechanical impedance and properties made variable via the additional piezoelectric properties of the stack materials overcomes the prior art disadvantages, shortcomings and limitations of manufacturing techniques, acoustic power leakage and inability to meet the single-frequency, quarter-wavelength criterion due to manufacturing deviations.

DETAILED DESCRIPTION OF THE DRAWINGS

Figure 1:
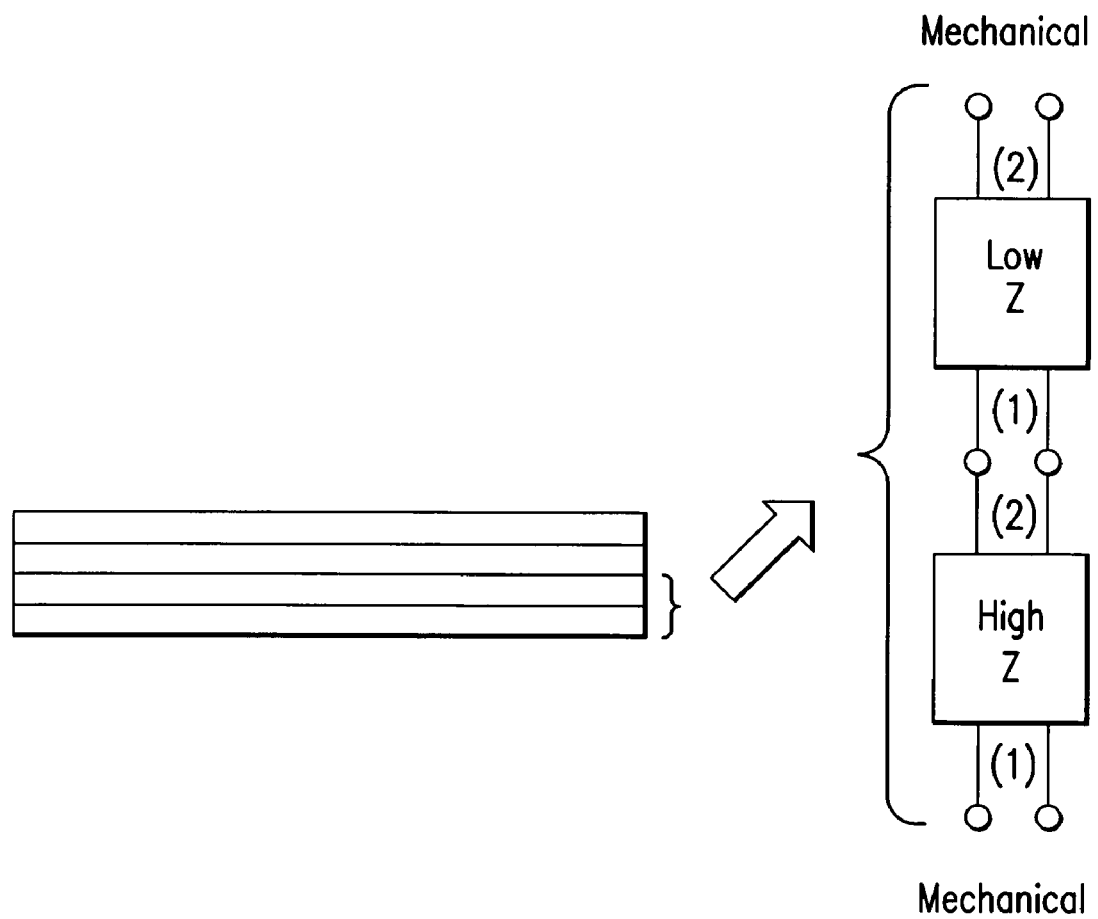
FIG. 1 is a schematic drawing of a prior art SMR.
Figure 2:
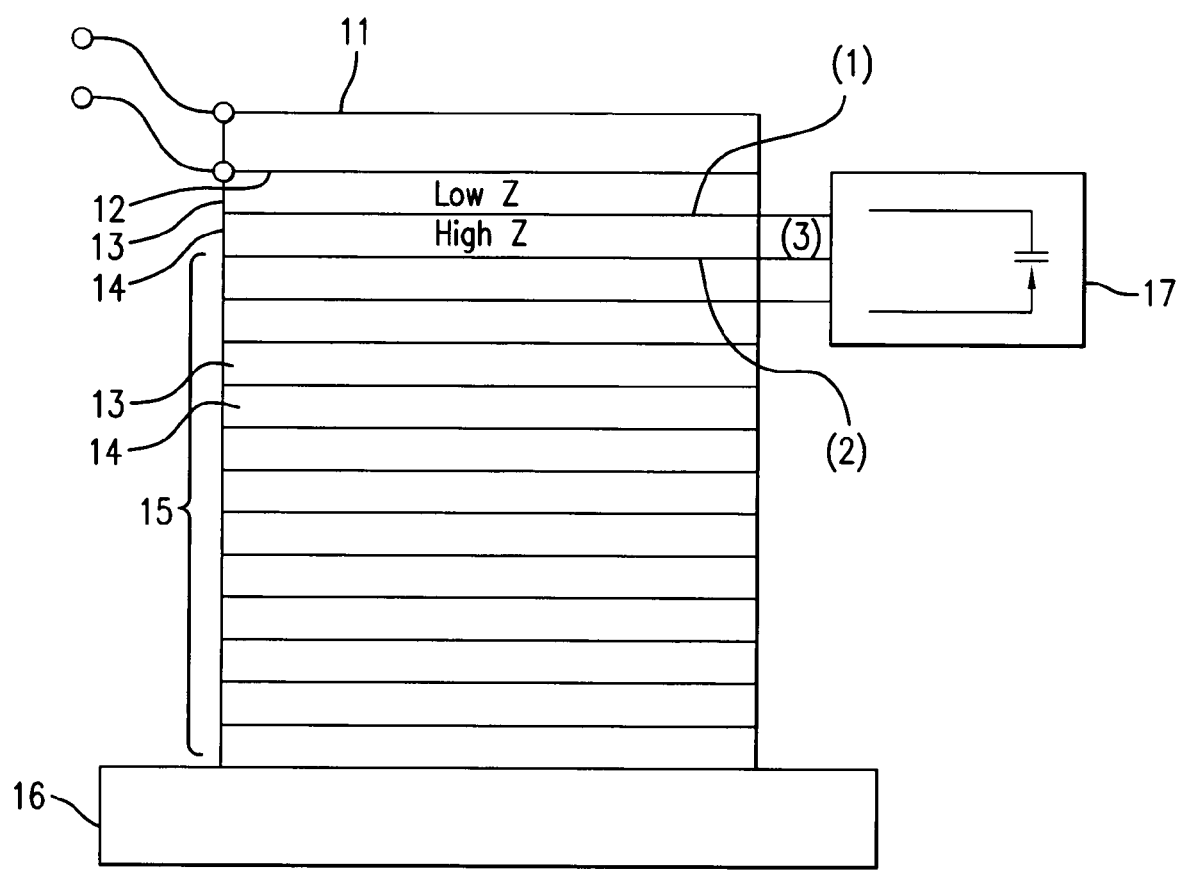
FIG. 2 is a conceptual drawing of this invention's agile tunable piezoelectric SMR.

Referring now to the drawings, FIG. 2 is a conceptual drawing depicting the agile tunable piezoelectric SMR 10 with open circuit (OC) and short circuit (SC) capacity, comprising a piezoelectric resonator 11 having a bonded face 12, a layer of low mechanical impedance material 13, a layer of high mechanical impedance material 14, and multiple alternating layers of low mechanical impedance and high mechanical impedance material 15, all of which are stacked on a substrate 16. The layers 13 and 14 are connected to an illustrative adaptive circuit 17.

In operation, the lower surface 12, or bonded face, of piezoelectric resonator 11 "sees" very low acoustic impedance and is unable to radiate any acoustic power down the stacked layers 15 and into the substrate 16; so that virtually all energy is reflected back into the resonator 11, which results the ideal situation of an undiminished Q. By configuring the resonator 11, alternating layers 15 and substrate 16 in this way, the present invention is now able to realize the performance advantages that were previously only theoretical ones.

The underlying principles that make this invention such an innovative advance over the prior art are best understood in terms of mechanical input impedance, electrical input impedance, and the characteristics of piezoelectric layers. A piezoelectric plate, with one mechanical port attached to a load $Z_2$, and the electrical port attached to a load $Z_3$ has a normalized mechanical input impedance seen at port (1) of:

$$(Z_1/Z)=[A-k^2B]/[C-k^2D] \quad \text{Equation (2)}$$

where $A=[Z_2+j\ Z\ \tan(\theta)]\cdot(1+j\ Z_e)$; $B=[Z_2\ T(\theta)+j\ Z\ \tan(\theta)\ T(\theta/2)]$;
$C=[Z+jZ_2\ \tan(\theta)]\cdot(1+j\ Z_e)$; and $D=[Z\ T\ (\theta)]$, where $Z_e=[Z_3(\omega C_o)]$, and
$T(x)=[\tan(x)/x]$. For a variable capacitor at an electrical port (3):

$$Z_3=1/(j\omega C_o\zeta) \quad \text{Equation (3)}$$

where $\zeta=0$: open circuit; $1/\zeta\rightarrow 0$: short circuit. Zeta ($\zeta$) is not limited to these extreme values, but may take on any value in between the extremes, depending upon the degree of adjustment of the parameters of the layers of the stack desired. Open-circuit and short-circuit conditions are emphasized here because they represent limits, and also lead to simpler formulas. The equations will assume different limiting forms corresponding to open circuit and short circuit conditions and whether the substrate is soft or rigid. In the case of short circuit at port (3) with a soft substrate where $Z_s=0$, the following equation applies:

$$\left(\frac{z_1}{z_p}\right) = +j\frac{\tan(\theta)\left[1-k^2\frac{\tan(\theta/2)}{\theta/2}\right]}{\left[1-k^2\frac{\tan(\theta)}{\theta}\right]} \quad \text{Equation (4)}$$

In the case of short circuit at port (3) with a rigid substrate where $Y_s=0$, the following equation applies:

$$\left(\frac{z_1}{z_p}\right) = \frac{\left[1-k^2\frac{\tan(\theta)}{(\theta)}\right]}{j\ \tan(\theta)} \quad \text{Equation (5)}$$

In the case of an open circuit at port (3) with a soft substrate where $Z_s=0$ the following equation applies:

$$\left(\frac{z_1}{z_p}\right) = +j\ \tan(\theta) \quad \text{Equation (6)}$$

In the case of an open circuit at port (3) with a rigid substrate where $Y_s=0$, the following equation applies:

$$\left(\frac{z_1}{z_p}\right) = \frac{1}{j\tan(\theta)} \qquad \text{Equation (7)}$$

In the above equations, θ (theta) has the same meaning as in Equation (1), and k is the electromechanical (piezoelectric) coupling coefficient. The value of k is fixed for a given piezoelectric material and has a maximum value of unity. For non-piezoelectric stacks where $k^2=0$, the open circuit equation for a loaded TL is used recursively to transform from layer to layer. In the piezoelectric case, it is necessary to use the more general Equation (2) given above. In the limit of $Z_2=0$ (free surface):

$$(Z_1/Z) = j\tan(\theta) \cdot \{[1-k^2T(\theta/2)]+j[Z_e]\}/\{[1-k^2T(\theta)]+j[Z_e]\} \qquad \text{Equation (8)}$$

and when $1/Z_2 \to 0$ (rigid surface), $(Z_1/Z) \to [1/(j\tan(\theta))]([1-k^2T(\theta)]+j[Z_e])/\{1+j[Z_e]\}$.

Regarding the electrical input impedance, a piezoelectric plate with mechanical ports attached to loads $Z_1$ and $Z_2$, has a normalized electrical input impedance seen at port (3) of:

$$[Z_3(j\omega C_o)] = z_{in} = [1-k^2\{[N_1+jN_2]/[D_1+jD_2]\}] \qquad \text{Equation (9)}$$

where $N_1=[Z(Z_1+Z_2)T(\theta)]$; $N_2=[Z^2 \tan(\theta)T(\theta/2)]$; $D_1=[Z(Z_1+Z_2)]$; and $D_2=[(Z^2+Z_1Z_2)\tan(\theta)]$. The relationship when one surface is free ($Z_1=0$) in the limits of soft and rigid substrates is different according to whether the substrate is soft or rigid. In the case of a soft substrate where $Z_s=0$, the following equation applies:

$$z_{in} \cdot (j\omega C_0) = \left(1 - k^2 \frac{\tan(\theta/2)}{(\theta/2)}\right) \qquad \text{Equation (10)}$$

In the case of a rigid substrate where $Y_s=0$, following equation applies:

$$z_{in} \cdot (j\omega C_0) = \left(1 - k^2 \frac{\tan(\theta)}{(\theta)}\right) \qquad \text{Equation (10)}$$

If both surfaces are clamped, $z_{in}=1$, and if both surfaces are free, then $z_{in}=[1-k^2T(\theta/2)]$. In both cases, the piezoelectric transformer ratio, n, is related to the other parameters by $n^2=[Zk^2\omega C_o/\theta]$.

Regarding piezoelectric stacks, the resonator input impedance is given, and the term $Z_{substrate}$ is defined by 3-by-3 matrices, as follows:

$$Z_{substrate}=\{[0,0,0],[0,Z,0],[0,0,0]\} \qquad \text{Equation (11)}$$

where $Z_H=\{[Z_{11H}, Z_{12H}, Z_{13H}], [Z_{12H}, Z_{11H}, Z_{13H}], [Z_{13H}, Z_{13H}, Z_{33H}]\}$; $Z_L=\{[Z_{11L}, Z_{12L}, Z_{13L}], [Z_{12L}, Z_{11L}, Z_{13L}], [Z_{13L}, Z_{13L}, Z_{33L}]\}$; the $Z_{Hk}$ layer$=\{[0,0,0], [0,Z_{2Hk},0], [0,0,Z_{eHk}]\}$; the $Z_{Lk}$ layer$=\{[0,0,0], [0,Z_{2Lk},0], [0,0,Z_{eLk}]\}$; $Z_{L1}=\{[0,0,0], [0,Z_{2L1},0], [0,0,0]\}$; $Z_{resonator}=\{[Z_{11}, Z_{12}, Z_{13}], [Z_{12}, Z_{11}, Z_{13}], [Z_{13}, Z_{13}, Z_{33}]\}$. Here, the subscripts L and H refer to the low- and high-mechanical impedances, respectively. The resonator matrix elements are: $Z_{11}=Z/(j\tan(\theta))$; $Z_{12}=Z/(j\sin(\theta))$; $Z_{13}=n/(j\omega C_o)$; $Z_{33}=1/(j\omega C_o)$, and the elements of other matrices follow in like manner by systematic replacement. For example, $Z_{13L}=n_L/(j\omega C_{oL})$, and so on. Recursive relations for a piezo-Bragg stack of k bi-layers then are:

$$W_{Hk}=Z_H+Z_{substrate}; Y_{Hk}=((W_{Hk})^{-1})_{11}; Z_{1Hk}=(Y_{Hk})^{-1}=Z_{2Lk}(\text{into } Z_{Lk});$$

$$W_{Lk}=Z_L+Z_{Lk}; Y_{Lk}=(W_{Lk})^{-1})_{11}; Z_{1Lk}=(Y_{Lk})^{-1}=Z_{2H(k-1)} (\text{into } Z_{H(k-1)}); W_{H(k-1)}=Z_H+Z_{H(k-1)}$$

$$Y_{H(K-1)}=((W_{H(k-1)})^{-1})_{11}$$

$$Z_{1H(k-1)}=(Y_{H(k-1)})^{-1}=Z_{2L(k-1)} (\text{goes into } Z_{L(k-1)}); \text{et seq.}, \qquad \text{Equation (12)}$$

And finally the resonator input impedance $Z_{in}$ is found from:

$$W_{resonator}=Z_{resonator}+Z_{L1}$$

$$Y_{resonator}=((W_{resonator})^{-1})_{33}$$

$$Z_{in}=(Y_{resonator})^{-1}. \qquad \text{Equation (13)}$$

In order to minimize the number of variables, the following simplifications have been employed: No electrode mass/thickness; no losses (except radiation into unbounded substrate); unit area; all electrical port loadings equal and normalized to a fraction of the impedance of $C_o$:

$$Z_{3H}=Z_{3L}=1/(\zeta j 2\pi f_A C_o)$$

$$Z_L=mZ, \text{ and } Z_H=Z/m, \qquad \text{Equation (14)}$$

where Z is the mechanical impedance of the resonator and substrate; acoustic velocities and thicknesses equal: $v_H=v_L=v=V_{resonator}=v_{substrate}$; $t_H=t_L=t$, so $\theta_H=\theta_L=\theta=\omega t/v$; and the resonator thickness $l=2t$; $\theta_{resonator}=2\theta$; piezocouplings: $k_H=k_L$.

In summary, Equations 11-13 provide the means for computing the electrical input impedance of the resonator (Equation 13) when it is attached to the Bragg stack, which itself is attached to the substrate. Equation (14) makes a few simplifying assumptions to reduce the complexity of the algebra, but these simplifications should not be construed as limiting the present invention described herein.

A source immittance will appear in the expression for power delivered to the substrate, but for a pure voltage source (SC), power$=\frac{1}{2} V^2 G \propto \text{Re}[Y]$, and for a pure current source (OC), power$=\frac{1}{2} I^2 R \propto \text{Re}[Z]$. It is noted that the symbol "Re" denotes taking the real part of the complex admittance, Y, or of impedance, Z.

Referring now to FIGS. 3 and 4, which are charts of eight-layer and ten-layer SMR stacks at OC and SC conditions in accordance with the present invention, these charts depict the enhanced performance of the agile tunable piezoelectric SMR. These charts demonstrate that the OC and SC curves align with the resonance and anti-resonance frequencies of an equivalent resonator mounted on a Bragg stack to that of an unmounted resonator, which is indicated by the dashed lines on each chart. One may wish to operate the mounted resonator at a fixed frequency, such as its resonance frequency, and, if the parameters of the stack are properly chosen, a SC on all of the layers of the stack can be made to bring the stack to the proper quarter-wavelength criterion so that the mounted resonator and stack achieve the highest Q.

Figure 3A:
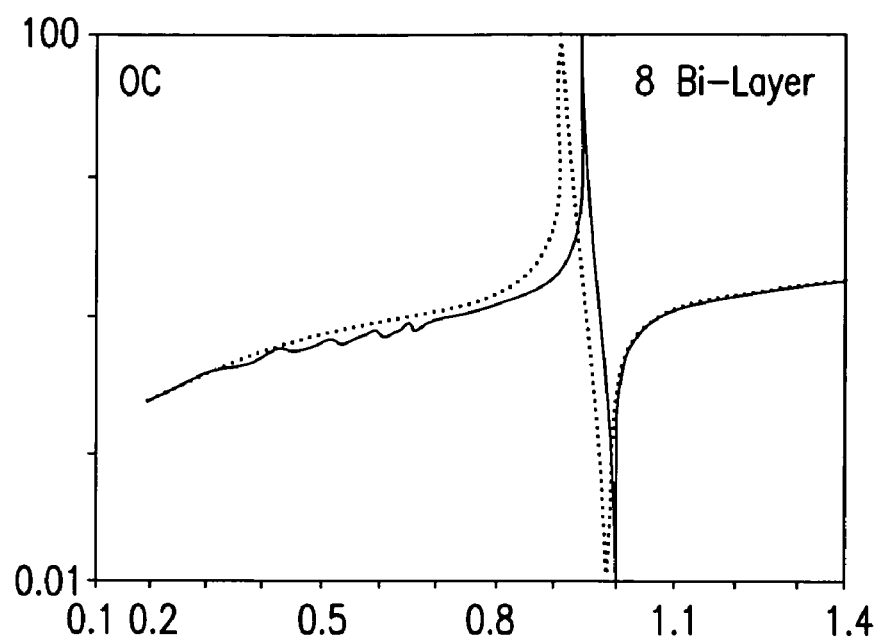
FIG. 3 is a plot of an eight-layer SMR stack in accordance with the present invention at open circuit and short circuit conditions.
Figure 3B:
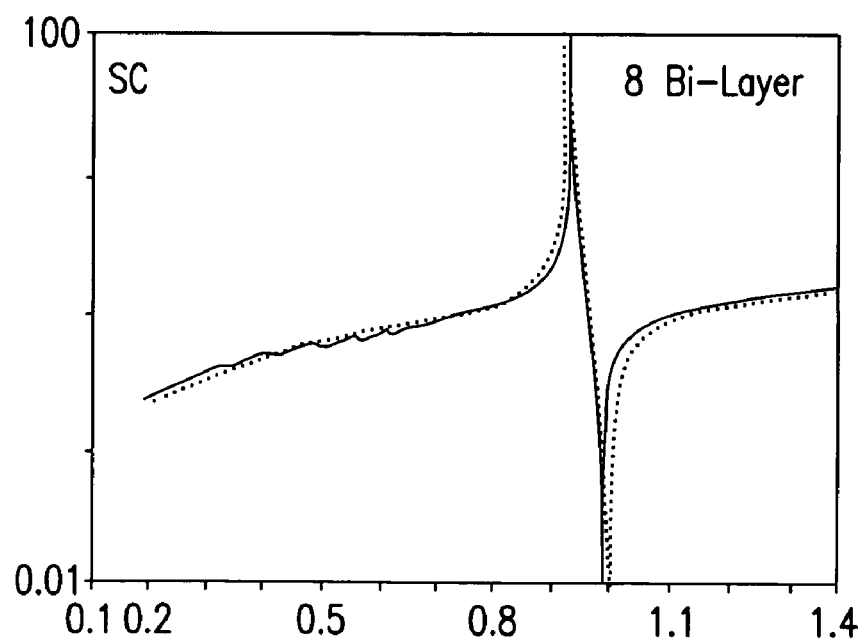
Figure 4A:
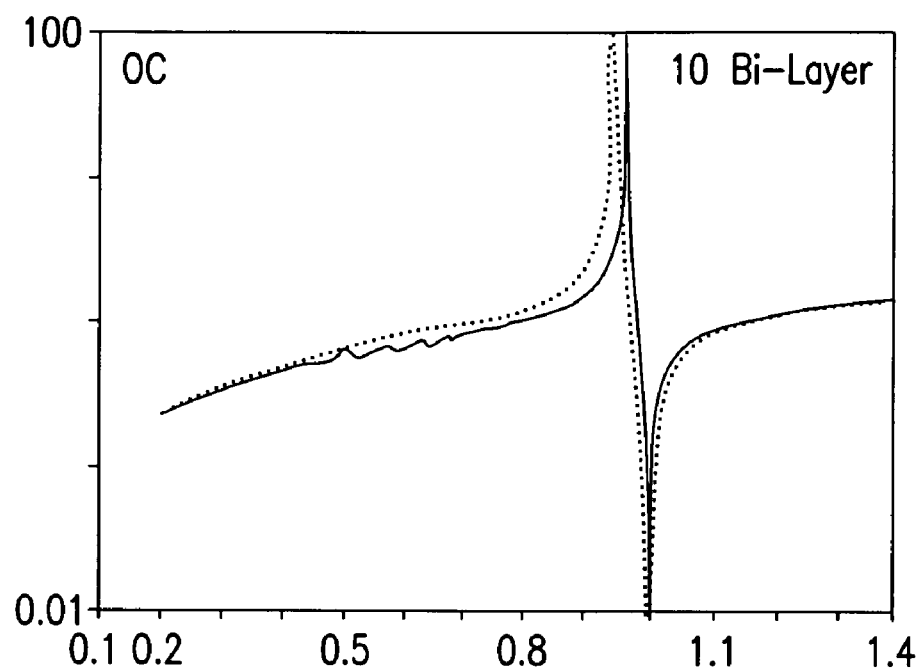
FIG. 4 is a plot of a ten-layer SMR stack in accordance with the present invention at open circuit and short circuit conditions; and Table I is a chart indicating relative acoustic power lost into the substrate at open circuit and short-circuit conditions in accordance with the present invention.
Figure 4B:
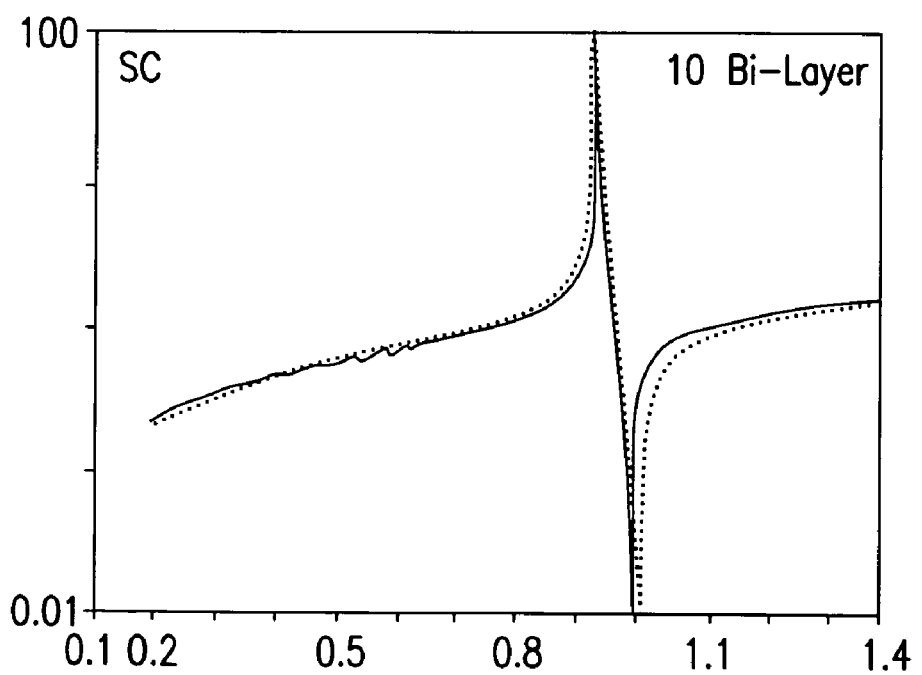

Referring now to FIGS. 3A and 3B, all of the curves plot frequency along the horizontal axis, or abscissa, and normalized input electrical admittance along the vertical axis, or ordinate axis, on a logarithmic scale. "Normalized" means the scale is adjusted to a common value, so that all curves overlap at both low and high frequencies; this is requisite for comparison purposes. "Logarithmic" means that the vertical scales are compressed according to a well-known mathematical function, so that very large changes in size can be shown on the same plot.

The dotted curve in all cases is the response of an idealized resonator that is unattached to any structure; it is suspended in space, and therefore unable to lose any acoustic energy to its surroundings. This is the unmounted resonator. When the frequency of the source energizing the resonator is low, the resonator is unresponsive; it behaves as a simple capacitor. As the frequency approaches the region to which the resonator is sensitive, the mechanically vibrating structure begins to execute large motions. Because the resonator structure is piezoelectric, the motion is translated into electrical current in the exciting wires, and the manifestation of this is the behavior of the electrical admittance, which is the reciprocal of impedance. As the resonance frequency is approached, the admittance becomes very large; and beyond this frequency, it rapidly decreases, and reaches a nadir at what is called the anti-resonance frequency. The admittance then increases again until it becomes relatively flat at high frequencies.

Now, a mounted resonator in accordance with this invention, sitting upon a Bragg stack which is itself attached to a substrate, will radiate acoustic energy into the substrate, or "shake" the substrate. This is an intolerable condition because it degrades the resonator quality factor (Q), a very important parameter in oscillators, filters, and signal processing devices in general. The Bragg stack 15 obviates the mounting problem because it acts as an isolator between the resonator 11 and the substrate 16. Actually, the Bragg stack of alternating materials 15 acts as an impedance transforming device, which reflects the energy of the resonator 11 back to the resonator 11 because of coherent internal reflections within the layers of the stack 15, so that very little escapes down to the substrate 16. Unfortunately, conventional prior art Bragg stacks can only truly be perfectly reflecting at just one frequency, and even to do this, all of the layers of the stack must be identical in manufacture, which is a practical impossibility. The critical frequency is that which renders each individual layer of the stack exactly one-quarter of a wavelength thick and this invention's advantageous arrangement achieves that goal.

The present invention takes advantage of the piezoelectric effect to overcome and obviate the shortcomings of limitation to a single frequency and the practical impossibility of perfect construction during manufacture. Instead of fashioning the Bragg stack from non-piezoelectric materials, as is the case heretofore, this invention's Bragg stack 15 is composed of piezoelectric materials, thereby permitting the stack properties to be modified by the simple expedient of changing the electrical boundary conditions on the stack layers 15. This does require that the layers be provided with electrodes to effect the change, and also requires additional circuitry 17 adjacent to the stack. However, these additional requirements are inexpensive and more than repay the advantage of adjustability.

In accordance with this invention, the resonator 11 sitting on the alternating material Bragg stack 15 operates by virtue of its piezoelectricity. In addition, the presence of piezoelectricity in the alternating layers of the Bragg stack 15 allows the layers to appear as if their physical behavior has been changed when the electrodes coating the layers are attached to ancillary circuitry 17 that provide the requisite SC or OC conditions. Further, each layer of the stack 15 can be individually tuned to accommodate to manufacturing deviations from layer to layer.

A preferred embodiment of the agile, tunable piezoelectric SMR with OC and SC capability would be from six to ten bi-layers with the low acoustic impedance, z, material being gallium arsenide (GaAs), zinc oxide (ZnO), lithium niobate (LiNbO$_3$), or barium titanate (BaTi O$_3$) and the high acoustic impedance, z, material being gallium nitride (GaN), aluminum nitride (AlN), boron nitride (BN), or silicon carbide (SiC). However, numerous other compositions of materials and number of layers are also considered to be within the contemplation of the present invention.

In addition to adjusting the individual layers, this invention allows one to use the electrodes attached to the layers 15 to vary the properties with time dynamically. This is a critical feature of the invention. As the conditions on the electrodes are changed, for example from an OC to an SC condition, the frequency at which it becomes one-quarter of a wavelength thick also changes. Thus the Bragg stack can be made to track the resonator which is attached to it.

The charts depicting curves for eight and ten bi-layers comprising the Bragg stack show how the stack affords greater and greater isolation of the resonator from the substrate. As the number of bi-layers increases from eight in FIGS. 3A and 3B to ten in FIGS. 4A and 4B, the structure more accurately resembles the isolated resonator indicated by the dashed curves. The difference between the OC and SC curves in these charts is that the OC curves have been simulated to make the anti-resonance frequency of the stack 15 align with the anti-resonance frequency of the resonator 11 sitting on top of the stack 15. Similarly, the SC curves in these charts show the simulated case where the resonance frequency of the stack 15 aligns with the resonance frequency of the resonator 11 sitting on top of the stack 15. For the sake of simplifying a rather complicated demonstration, the physical parameters of the stack materials and that of the resonator have been adjusted to show that, by piezoelectric means, the stack may be tuned from the resonance to the anti-resonance resonator frequencies. Those skilled in the art will realize that other parameter values could be chosen to allow a wider variation of the Bragg stack.

Table I gives the Q-degrading relative power lost into the substrate at SC and OC conditions, at various frequencies lying between the normalized equi-immittance frequencies, where $\Omega_{h,g}=1\pm(2k/\pi)$, and k is the electromechanical (piezoelectric) coupling factor. The equi-immittance frequencies span the frequency range where the resonator is considered to be substantially active.

| RELATIVE POWER INTO SUBSTRATE | | |
|---|---|---|
| Normalized Frequency, $\Omega$ | Re $(Y_{in})$ (SC) | Re $(Y_{in})$ (OC) |
| $0.809 \approx \Omega_g$ | 0.0152 | 0.0371 |
| 0.837 | 0.0150 | 0.0351 |
| 0.866 | 5.14E-3 | 0.0114 |
| 0.894 | 1.80E-3 | 4.00E-3 |
| 0.922 | 9.37E-4 | 2.14E-3 |
| 0.951 | 1.28E-4 | 2.38E-4 |
| $0.9635 \approx \Omega_R$ | 1.61E-4 | 4.31E-4 |
| 0.980 | 8.90E-7 | 3.30E-6 |
| 1.008 | 1.74E-8 | 4.83E-8 |
| $1.0365 \approx \Omega_A$ | 2.36E-5 | 7.02E-5 |
| 1.037 | 2.41E-5 | 7.16E-5 |
| 1.065 | 3.45E-4 | 1.01E-3 |
| 1.094 | 1.29E-3 | 3.87E-3 |
| 1.122 | 3.35E-3 | 0.0104 |
| 1.151 | 9.80E-3 | 0.0298 |
| 1.179 | 0.0280 | 0.0817 |
| $1.208 \approx \Omega_h$ | 0.0317 | 0.0905 |

A number of variations of the agile, tunable piezoelectric SMR are considered to be within the contemplation of this invention. These variations include the number of stacked layers, as well as the composition of the high acoustic impedance and low acoustic impedance layers. Other variations would include attachments to the electrical ports of the Bragg stack immittances other than the limiting cases of open- or short-circuits. For example, each member of each bi-layer might have a capacitor of differing value attached to its electrical port, so for a six-bi-layer stack this would mean twelve capacitors of different values. Other variations would include the use of different inductors, or a combination of capacitors and inductors for each layer, or, indeed, any of a variety of active elements, such as transistors or sources of common voltage. The fact that the SMR is mounted contiguous to integrated circuitry permits a huge variety of electrical conditions to be impressed on each of the layers at virtually no cost and very little complexity.

The present invention also includes agile tunable piezoelectric solidly-mounted resonator system and many of the variations from the resonator embodiment apply to the system as well.

This invention also encompasses a method for generating piezoelectric properties in an agile tunable solidly-mounted resonator, comprising the steps of forming a piezoelectric resonator; configuring the piezoelectric resonator with a bonded face, a given amount of acoustic energy and a given Q; selecting a group of piezoelectric low mechanical impedance materials and a group of piezoelectric high mechanical impedance materials; forming a group of piezoelectric layers of low mechanical impedance material; forming a group of piezoelectric layers of high mechanical impedance material; interleaving the piezoelectric layers of low mechanical impedance material and the piezoelectric layers of high mechanical impedance material into alternating piezoelectric bi-layers of low impedance material and high impedance material with piezoelectric characteristics; stacking the piezoelectric resonator on a first one of the bi-layers; forming a substrate; and stacking the bi-layers on the substrate. The method continues with the steps of connecting at least one of the bi-layers to an adaptive circuit that alternates with an external electrical impedance; generating an amount of electrical energy between an open circuit and a short circuit; providing the bi-layers with coherent internal reflections; exposing the bonded face to a low acoustic impedance; preventing the bonded face from radiating the given amount of acoustic energy down into the bi-layers and into the substrate because the given amount of acoustic energy is reflected back to the resonator due to the coherent internal reflections; and preserving the given Q, preventing an unwanted leakage and an unwanted frequency shift and allowing the resonator to be tunable.

It is to be further understood that other features and modifications to the foregoing detailed description are within the contemplation of the present invention, which is not limited by this detailed description. Those skilled in the art will readily appreciate that any number of configurations of the present invention and numerous modifications and combinations of materials, components, arrangements and dimensions can achieve the results described herein, without departing from the spirit and scope of this invention. Accordingly, the present invention should not be limited by the foregoing description, but only by the appended claims.

What I claim is:

1. A method for generating piezoelectric properties in an agile tunable solidly-mounted resonator, comprising the steps of:
    forming a piezoelectric resonator;
    configuring said piezoelectric resonator with a bonded face, a given amount of acoustic energy and a given Q;
    selecting a plurality of piezoelectric low mechanical impedance materials and a plurality of piezoelectric high mechanical impedance materials;
    forming a plurality of piezoelectric layers of low mechanical impedance material;
    forming a plurality of piezoelectric layers of high mechanical impedance material;
    interleaving said plurality of piezoelectric layers of low mechanical impedance material and said plurality of piezoelectric layers of high mechanical impedance material into a plurality of alternating piezoelectric bi-layers of low impedance material and high impedance material with a plurality of piezoelectric characteristics;
    stacking said piezoelectric resonator on a first one of said plurality of bi-layers;
    forming a substrate;
    stacking said plurality of bi-layers on said substrate;
    connecting at least one of said plurality of bi-layers to an adaptive circuit that alternates with an external electrical impedance;
    generating an amount of electrical energy between an open circuit and a short circuit;
    providing said plurality of bi-layers with a plurality of coherent internal reflections;
    exposing said bonded face to a low acoustic impedance;
    preventing said bonded face from radiating said given amount of acoustic energy down into said plurality of bi-layers and into said substrate because said given amount of acoustic energy is reflected back to said resonator due to said plurality of coherent internal reflections; and
    preserving said given Q, preventing an unwanted leakage and an unwanted frequency shift and allowing said resonator to be tunable.

2. The method for generating piezoelectric properties in the agile tunable solidly-mounted resonator, as recited in claim 1, further comprising the step of stacking said bonded face on a first one of said plurality of piezoelectric layers of low impedance material.

3. The method for generating piezoelectric properties in the agile tunable solidly-mounted resonator, as recited in claim 2, further comprising the steps of:
    connecting a pair of electrodes between said at least one of the plurality of bi-layers and said adaptive circuit to allow varying said plurality of piezoelectric characteristics over time; and
    providing each of said plurality of bi-layers to be tunable in order to accommodate manufacturing deviations.

4. The method for generating piezoelectric properties in the agile tunable solidly-mounted resonator, as recited in claim 3, further comprising the step of forming said resonator with between six to ten bi-layers.

5. The method for generating piezoelectric properties in the agile tunable solidly-mounted resonator, as recited in claim 3, further comprising the steps of:
    selecting said plurality of piezoelectric layers of low mechanical impedance material from the group of materials consisting of gallium arsenide (GaAs), zinc oxide (ZnO), lithium niobate ($LiNbO_3$), and barium titanate ($BaTiO_3$); and
    selecting said plurality of piezoelectric layers of high mechanical impedance material from the group of materials consisting of gallium nitride (GaN), aluminum nitride (AlN), boron nitride (BN), and silicon carbide (SiC).

6. The method for generating piezoelectric properties in the agile tunable solidly-mounted resonator, as recited in claim 3, further comprising the step of forming a soft substrate.

7. The method for generating piezoelectric properties in the agile tunable solidly-mounted resonator, as recited in claim 3, further comprising the step of forming a rigid substrate.

* * * * *